United States Patent [19]
Gosser

[11] Patent Number: 5,903,191
[45] Date of Patent: May 11, 1999

[54] DIGITALLY CONTROLLED VARIABLE TRANSCONDUCTANCE AMPLIFIER SYSTEM

[75] Inventor: Royal Arlo Gosser, Greensboro, N.C.

[73] Assignee: Analog Devices, Inc., Norwood, Mass.

[21] Appl. No.: 09/012,305

[22] Filed: Jan. 23, 1998

[51] Int. Cl.[6] ............................... H03F 3/45; H03F 3/68; H03F 1/14; G06G 7/12

[52] U.S. Cl. ......................... 330/254; 330/295; 330/51; 327/355

[58] Field of Search ................................. 330/254, 295, 330/124 R, 51; 327/355, 356, 352, 350

[56] References Cited

U.S. PATENT DOCUMENTS 5,045,804  9/1991  Sugawara et al. ..................... 330/51
5,821,810  10/1998 Swart et al. .......................... 330/254

OTHER PUBLICATIONS

Gilbert, Barrie, "A High–Performance Monolithic Multiplier Using Active Feedback", IEEE J. Solid–State Circuits, vol. SC–9, pp. 364–373, Dec. 1974.

"8–Bit, High Speed, Multiplying D/A Converter (Universal Digital Logic Interface", Product Data Sheet DAC08, Analog Devices, Inc.

*Primary Examiner*—Robert Pascal
*Assistant Examiner*—Patricia Nguyen
*Attorney, Agent, or Firm*—Iandiorio & Teska

[57] ABSTRACT

A digitally controlled variable transconductance amplifier system including first and second input means for receiving first and second input voltages of opposite phase; first and second output means; a voltage to current converter system responsive to the input voltage and including a reference voltage to current converter and a plurality of voltage to current converters each having a different gain relative to the reference voltage to current converter such that the total gain of the voltage to current converters is less than that of the reference converter; each of the converters providing a pair of oppositely phased converter output currents; and a summing system including a reference switching circuit and a plurality of switching circuits, the reference switching circuit and the switching circuits being interconnected with said reference converter and the plurality of voltage to current converters, respectively, the summing system being responsive to a digital control signal for operating each of the switching circuit to selectively deliver one of the converter output currents from the associated converter to one of the first and second output means and the other of the converter output currents to the other of the output means for providing at said output means first and second output currents of opposite or in phase with constant common mode current and having a gain relative to the input voltages which is the sum or difference of the gains of all of the converters and is determined by the digital control signal.

13 Claims, 5 Drawing Sheets

DIGITALLY CONTROLLED VARIABLE TRANSCONDUCTANCE AMPLIFIER SYSTEM

FIELD OF INVENTION

This invention relates to a digitally controlled variable transconductance amplifier with constant common mode current.

BACKGROUND OF INVENTION

Variable attenuators and variable gain amplifiers are in great demand for use in wire and wireless communication applications such as cable modems and wireless receivers. Presently such devices use step attenuators, Gilbert multipliers or passive PIN diode attenuators. Passive PIN diode attenuators are discrete and difficult to integrate on a single chip. Step attenuators, though integratable, have relatively low absolute accuracy. The Gilbert multipliers do not provide the relative noise and distortion levels required for many communication applications. In addition, gain accuracy is also lower. Another variable gain function that is similar in functionality to this invention is a four-quadrant multiplier. Here two two-quadrant integrated multipliers are required to be parallel connected. As such the overall common mode rejection and offset accuracy is relatively poor.

SUMMARY OF INVENTION

It is therefore an object of this invention to provide an improved digitally controlled variable transconductance amplifier.

It is a further object of this invention to provide such an improved digitally controlled variable transconductance amplifier with constant common mode current.

It is a further object of this invention to provide such an improved digitally controlled variable transconductance amplifier with low noise and distortion.

It is a further object of this invention to provide such an improved digitally controlled variable transconductance amplifier having high gain range and step accuracy.

It is a further object of this invention to provide such an improved digitally controlled variable transconductance amplifier with low differential mode switching glitches and fast settling times upon switching gain.

The invention results from the realization that a digitally controlled variable transconductance amplifier system having constant common mode current, low noise, and low distortion can be effected by submitting the differential input voltage to a voltage to current converter system having a plurality of voltage to current converter circuits each of which provides a pair of oppositely phased converter output currents and then switching those currents to add or subtract current in response to a digital switching control signal to form oppositely phased differential output currents of predetermined gain relative to the differential input voltage.

This invention features a digitally controlled variable transconductance amplifier system. There are first and second input means for receiving first and second input voltages of opposite phase and first and second output means. A voltage to current converter system responsive to the input voltages includes a reference voltage to current converter and a plurality of voltage to current converters each having a different gain relative to the reference voltage to current converter, so that the total gain of the voltage to current converters is less than that of the reference converter. Each of the converters provides a pair of oppositely phased converter output currents. A summing system includes a reference switching circuit and a plurality of switching circuits, the reference switching circuit and the switching circuits being interconnected with the reference converter and the plurality of voltage to current converters, respectively. The summing system is responsive to a digital control signal for operating each of the switching circuits to selectively deliver one of the converter output currents from the associated converters to one of the first and second output means and the other of the converter output currents to the other of the output means for providing at the output means first and second output currents of opposite phase or in phase with constant current mode current and having a gain relative to the input voltages which is the sum of the gains of all of the converters and is determined by the digital control signal.

In a preferred embodiment there may be first and second current sources for providing current of opposite phase to the output means. Each converter may include an amplifier. Each amplifier may be a transconductance amplifier. Each converter may include impedance means for defining their different gains. Each switching circuit may include a current steering switch. Each current steering switch may include two pairs of emitter coupled common based transistors. Each amplifier may include a pair of transistors with their emitters interconnected by an impedance. Each transistor may include a current source in series with its emitter or it may include an impedance in series with its emitter. Or it may include two impedances, one in series with each emitter and the other impedance ends connected to a single current source.

The system according to this invention may be at least one additional vernier voltage to current converter and an associated vernier switching circuit. The vernier switching circuit may be responsive to the digital control signal to deliver only one of the vernier converter output currents to one of the first and second output means for reducing the interval in selectable gains. The different gains of the converters may be an inverse function of $2^N$ where N+1 is the total number of converters and the reference converter has a gain factor of $2^0$ or 1.

DISCLOSURE OF PREFERRED EMBODIMENT

Other objects, features and advantages will occur to those skilled in the art from the following description of a preferred embodiment and the accompanying drawings, in which.

This invention provides a new and advantageous way of achieving accurate variable gains over a wide dynamic range while also achieving relatively low noise and distortion when compared to existing integrated solutions. Arbitrarily setting 0 db as maximum transconductance gain, this new function can be viewed as a digitally controlled variable transconductance attenuator. This attenuator function is simply a differential transconductance generator with differential voltage in, differential current out, with the overall transconductance value determined by digitally controlled current switches driven by a digital control signal and the transconductance values of the voltage to current converters.

Differential input/output signals are used to improve on distortion and high frequency common mode rejection. In addition, differential logic control allows for relatively low differential mode switching glitches and thus fast settling times upon switching the transconductance value.

Figure 1:
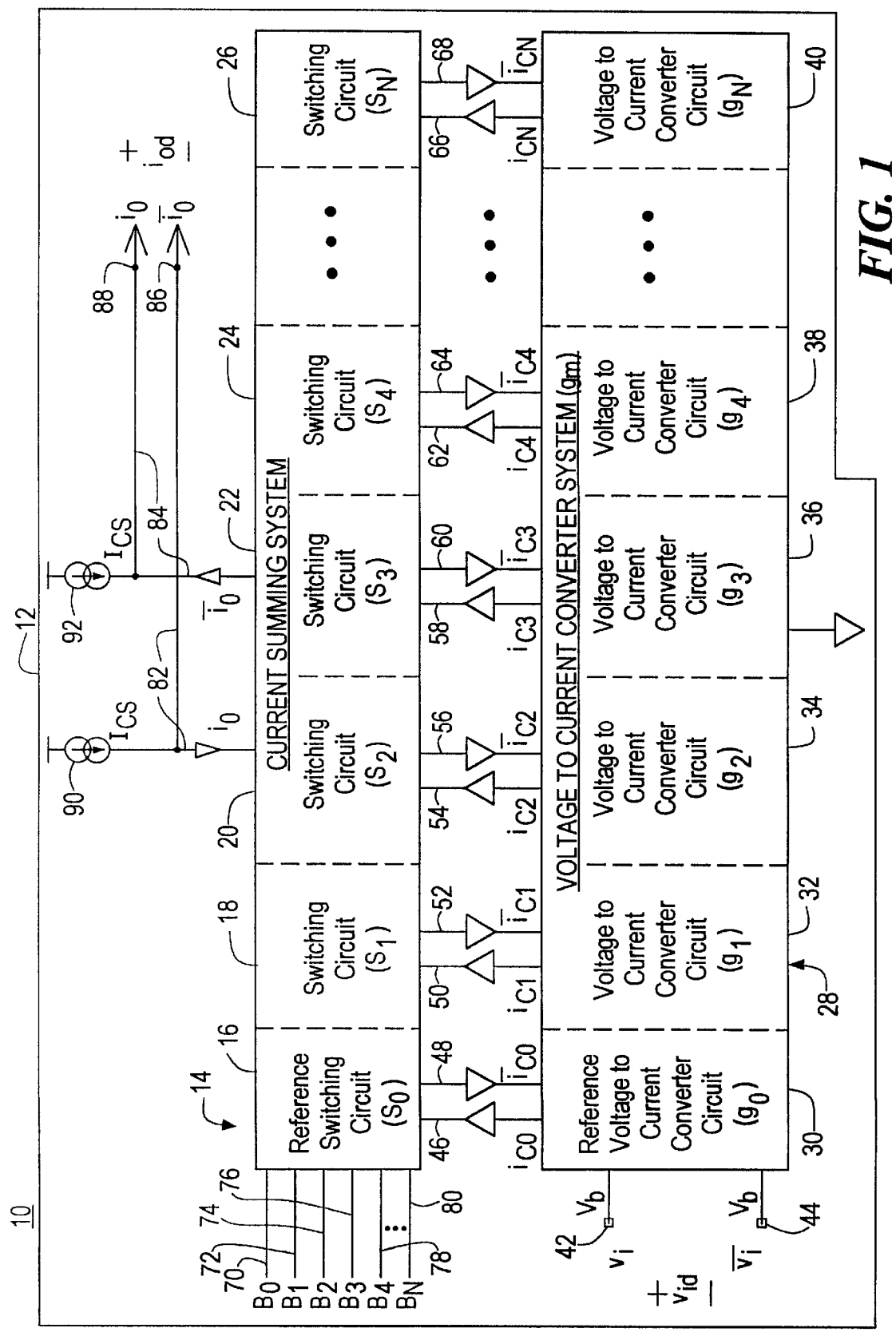
FIG. 1 is a simplified block diagram of a digitally controlled variable transconductance amplifier system according to this invention.

There is shown in FIG. 1 a digitally controlled variable gain transconductance amplifier system 10 according to this invention which is incorporated on a single integrated circuit chip 12. System 10 includes a current summing system 14 which includes reference switching circuit $S_0$ 16 and a plurality of additional switching circuits $S_1$ 18, $S_2$ 20, $S_3$ 22, $S_4$ 24 and $S_n$ 26. Voltage to current converter system 28 includes a similar arrangement of a reference voltage to current converter circuit 30 having a gain or transconductance $g_0$ and a number of other voltage to current converter circuits 32, 34, 36, 38 and 40 having gains $g_1$, $g_2$, $g_3$, $g_4$ and $g_N$. N+1 in both current summing system 14 and voltage to current converter system 28 is the total number of switching circuits or voltage current converter circuits. The total of those gains or transconductances $g_0$–$g_n$ are combined to obtain the total transconductance $G_m$.

Differential input voltage $V_{id}$ is presented to voltage to current converter system 28 by the application of $v_i$ and $\overline{v_i}$ at input terminals 42 and 44, each of which also receives d.c. bias voltage $V_B$. Each converter circuit 30 . . . 40 provides a pair of oppositely phased currents $i_{c0}$, $\overline{i_{c0}}$, lines 46 and 48; $i_{c1}$, $\overline{i_1}$, lines 50, 52; $i_{c2}$, $\overline{i_{c2}}$, lines 54, 56; $i_{c3}$, $\overline{i_{c3}}$, lines 58, 60; $i_4$, $\overline{i_{c4}}$, lines 62, 64; and $I_{cn}$, $\overline{i_{cn}}$, lines 66, 68, respectively, to the associated switching circuits 16 . . . 26. These currents are combined with the currents from reference switching circuit $S_0$ 16 by adding or subtracting them in accordance with the digital control word on lines 70, 72, 74, 76, 78, 80. These composite currents $i_0$, $\overline{i_0}$ are provided on output lines 82, 84 and appear at output terminals 86, 88 as the differential output current $i_{od}$. Current sources 90, 92 provide d.c. current $I_{CS}$ to both lines 82 and 84.

A transconductance attenuator according to this invention in its simplest form is composed of parallel connected differential transconductance stages. Each stage is cascode connected to a differential current switch stage as shown. Starting with the gain $g_0$, each successive transconductance stage of a voltage to current converter is reduced in gain by some scaling factor. In the embodiment disclosed herein the scaling factor is a binary reduction: that is, each succeeding voltage to current converter is reduced in value by a factor of two. Note that other factors can be used to realize a different gain versus code transfer function. For example, the gain could be positive referenced to 0 dB to make the system operate as a transconductance amplifier. Using binary weighting and N stages, each stage or voltage to current converter has a transconductance value of $g_0/2^n$ with n equal to 1, 2, 3, . . . N. The overall gain or attenuation level is thus controlled by the sum of the transconductance generators and the corresponding switch positions. The switches are digitally controlled by the binary word on lines 70–80.

Figure 2:
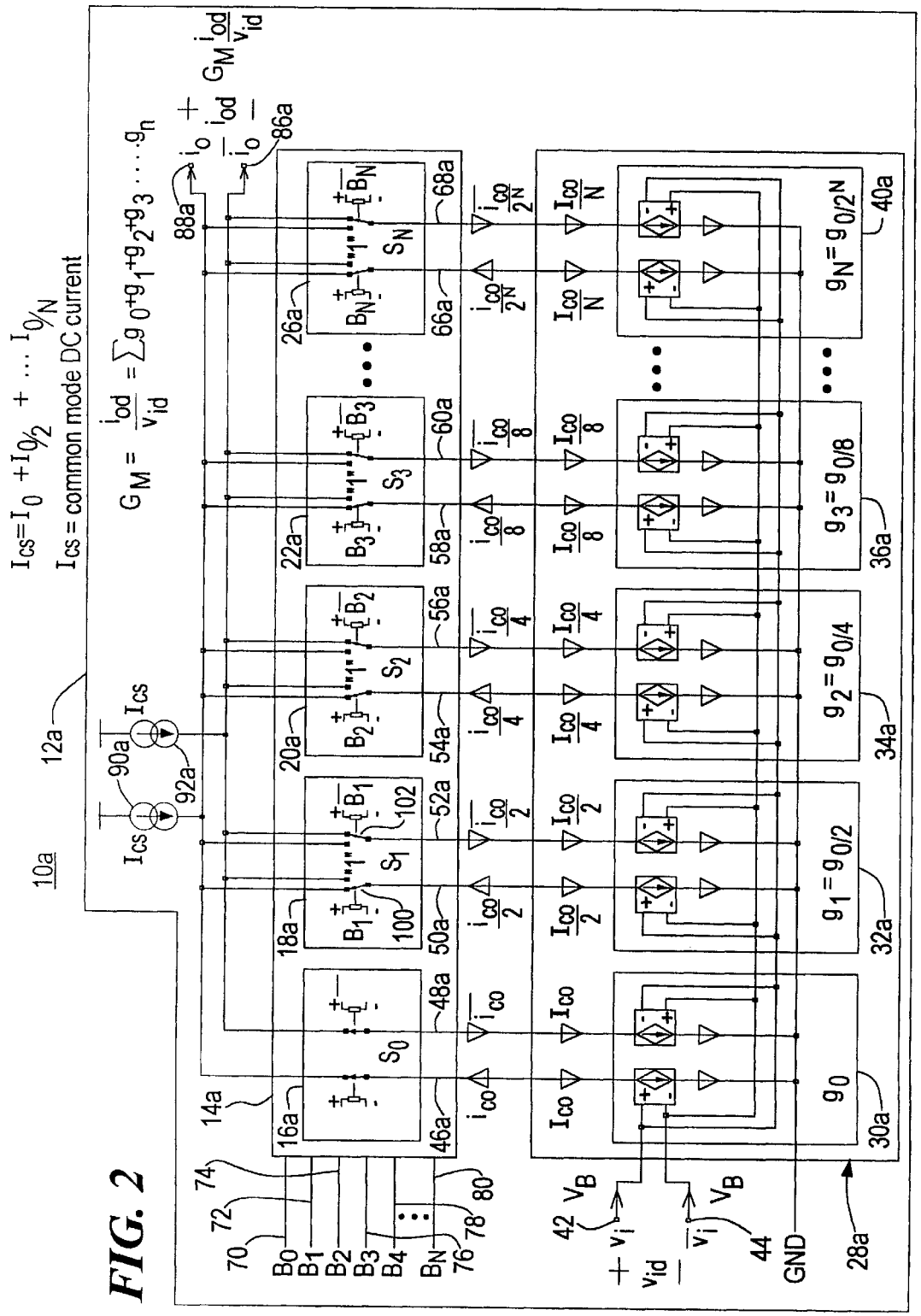
FIG. 2 is a more detailed schematic diagram of the transconductance amplifier system of FIG. 1.

A more detailed schematic block diagram of system 10 of FIG. 1 is shown in FIG. 2 where like parts have been given like numbers accompanied by a lower case a, and switching circuit S4 24 and voltage converter circuit $g_4$ 38 have been omitted to prevent crowding. FIG. 2 illustrates that switching circuit $S_0$ 16a is actually a dummy switch which always provides currents $i_{c0}$ and $\overline{i_{c0}}$ to output lines 84a and 82a, respectively. Each of the other switching circuits $S_1$ 18a . . . $S_N$ 26a have two different switching positions as illustrated with respect to switch $S_1$ depending upon the state of their respective binary control input signals $b_1$, $\overline{b_1}$, $b_2$, $\overline{b_2}$, $b_3$, $\overline{b_3}$, . . . $b_N$, $\overline{b_N}$. Again, for example, in switching circuit 18a each of the two switches 100 and 102 are shown in the logic 1 position where the current on line 50a is added to that on output line 84a, and the current on line 52a is added to that on output line 82a. If switch 1 were to receive a logical 0 signal then the switches would be moved to their other position, the current on line 52a would subtract from that on line 84a and the current on line 50a would subtract from the current on line 82a.

In FIG. 2 the currents flowing in lines 46a and 48a are again shown as $i_{c0}$ and $\overline{i_{c0}}$ but the currents in successive lines are shown as a function of $i_{c0}$. For example, the actual current $i_{c1}$, $\overline{i_{c1}}$ flowing on lines 50a and 52a is equal to $i_{c0}/2$ and $\overline{i_{c0}}/2$. So too with lines 54a, 56a where the current is shown as $i_{c0}/4$ and $\overline{i_{c0}}/4$, lines 58a and 60a, where the current is shown as $i_{c0}/8$ and $\overline{i_{c0}}/8$, and lines 66a and 68a where the current is shown as $i_{c0}/2^N$ and $\overline{i_{c0}}/2^N$.

The other currents shown on these same set of lines are the d.c. or common mode current components. For example, on lines 46a, 48a the d.c. current $I_{c0}$ is shown on both lines as the d.c. currents are not of opposite phase. On lines 50a and 52a the d.c. current is $I_{c0}/2$ in both cases; on lines 54a and 56a the d.c. current is $I_{c0}/4$ in both cases; on lines 58a and 60a the current is $I_{c0}/8$ in both cases; and on lines 66a and 68a the d.c. current is $I_{c0}/N$. Likewise, the gains in the differential transconductance circuits 30a, 32a, 34a, 36a and 40a which implement the voltage to current converter circuits is shown in terms of a function of the gain $g_0$ of the reference stage 30a. Thus the gain $g_1=g_0/2$, $g_2=g_0/4$, $g_3=g_0/8$, $g_N=g_0/2^N$. It can be seen then that the common mode d.c. current $I_{cs}$ is equal to $I_0+I_{c0}+I_{c0}/2+I_{c0}/4$, . . . $+I_{c0}/N$. Similarly, the total maximum transconductance gain can be expressed as:

$$g_M = i_{od}/v_{id} = g_0 + g_1 + g_{2+}g_3 \ldots g_N \text{ or } \sum_{n=0}^{N} gn.$$

For a given differential input voltage, then, $v_{id}$, the differential output currents from each stage are combined 1→N+1 directly on the output lines 82a and 84a. All the switches that are at logic 1 will add their respective a.c. output currents $I_c$ together and all switches that are at logic 0 will subtract at the common output lines 82a and 84a. The common mode or d.c. current at the output is constant and independent of the current switch logic states. Using the binarily weighted voltage to current converter circuits as shown, the net gain can also be represented by the relationship:

$$G_M = g_0(1 + \tfrac{1}{2}{}^*c_1 + \tfrac{1}{4}{}^*c_2 + \tfrac{1}{8}{}^*c_3 + \ldots \tfrac{1}{2}{}^{N*}c_N)$$

where $c_1$, $c_2$, . . . $c_N$ are the +1 and −1 logic coefficients to determine the net $G_m$ or the $i_{od}/v_{id}$ value for a given $g_0$. Thus net gain can also be expressed as $$G_M = g_0{}^*(2{}^*Code+1)/2^N$$

where Code represents the decimal equivalent of the digital control word. A +1 logic coefficient for any current switch corresponds to a logic 1 value and a -1 logic coefficient corresponds to a logic 0 value.

Figure 3:
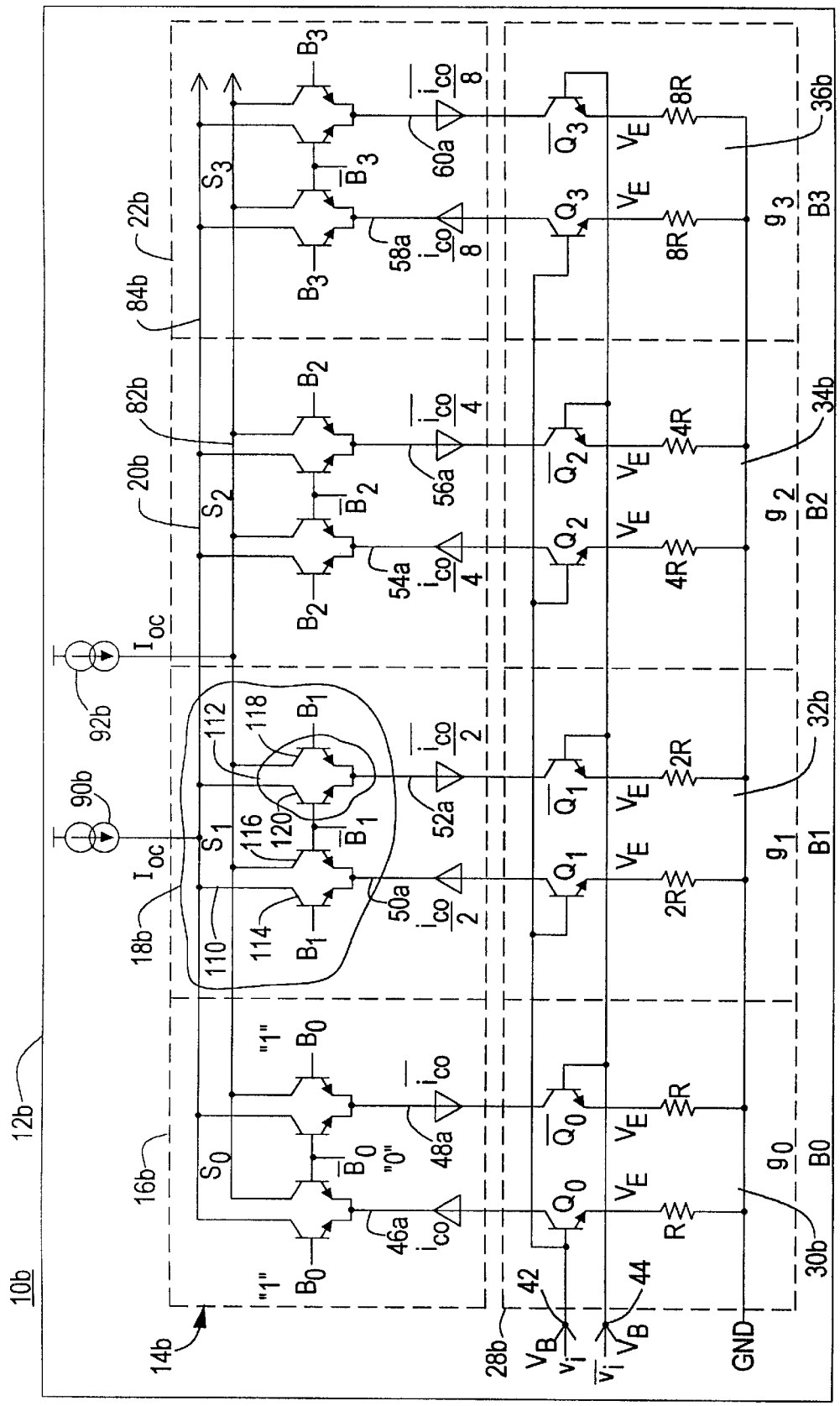
FIG. 3 is a schematic diagram of an integrated circuit which may be used to implement the system of FIGS. 1 and 2.

An implementation of the system of FIGS. 1 and 2 can also be made using CMOS or PNP transistors. A system $10b$ using NPN transistors is shown in FIG. 3 $10b$, where the nth stage of the switching circuit and voltage to current converter circuits have been omitted to prevent crowding. In FIG. 3, each of switching circuits $18b$ $S_0 \ldots S_3$ $22b$ are implemented using a current steering switch comprising two pairs 110, 112 of emitter connected NPN transistors 114, 116, 118 and 120. The bases of transistors 116 and 120 are presented with the $\overline{b_1}$ binary control signal whereas the bases of the other two transistors 114 and 118 presented with the $b_1$ signal. Each of the current converters $30b$–$36b$ is shown as a differential transconductance amplifier using a pair of transistors $Q_0$, $\overline{Q_0}$, $Q_1$, $\overline{Q_1}$, $Q_2$, $\overline{Q_2}$, $Q_3$, $\overline{Q_3}$, whose emitters are biased by resistors whose ratio and value determines the gains: circuit $30b$ uses resistors R to obtain gain $g_0$; circuit $32b$ uses resistors of value 2R to obtain gain $g_1$; circuit $34b$ uses resistors of value 4R to obtain gain $g_2$; and circuit $36b$ uses resistors of 8R to obtain gain $g_3$.

Figure 4:
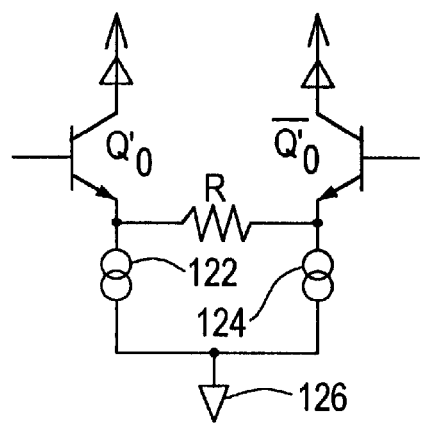
FIGS. 4, 5 and 6 are alternate embodiments of the voltage to current converters of FIG. 3.
Figure 5:
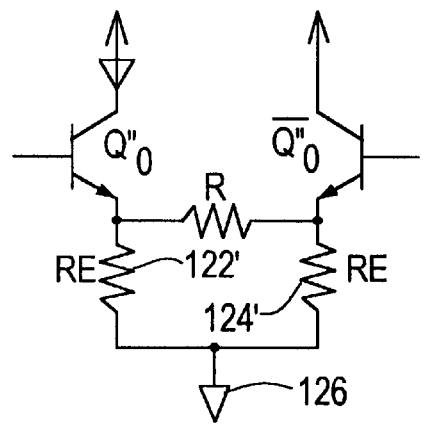
Figure 6:
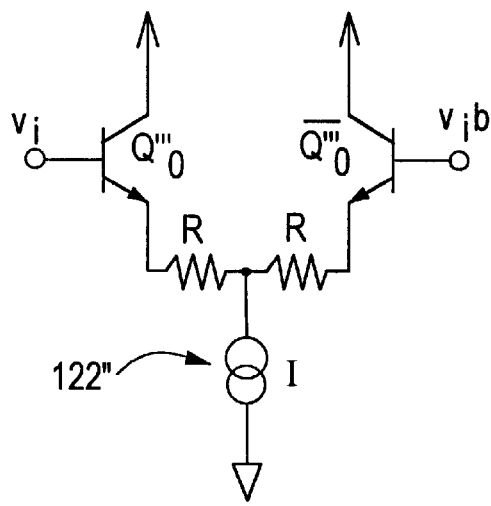

Although the voltage to current converter circuits have been shown in a specific construction, that is not a necessary limitation of the invention as any suitable alternative may be used. For example, as shown in FIG. 4, transistors $Q'_0$ and $\overline{Q'_0}$ may have their emitters interconnected by a resistor R and connected in series through current sources 122, 124 to ground 126. Or, as shown in FIG. 5, transistors $Q_0''$ and $\overline{Q_0''}$ may be provided with a resistor R connected between their emitters but with the current sources 122 and 124 replaced by resistance emitters 122' and 124'. Or, as shown in FIG. 6, with two resistors R, R connected between their emitters and current source 122" connected between the resistor junction and ground. These too can be implemented in CMOS or PNPs and FIG. 6 lends itself well to a single-ended entry input signal if differential input operation is not desired.

Figure 7:
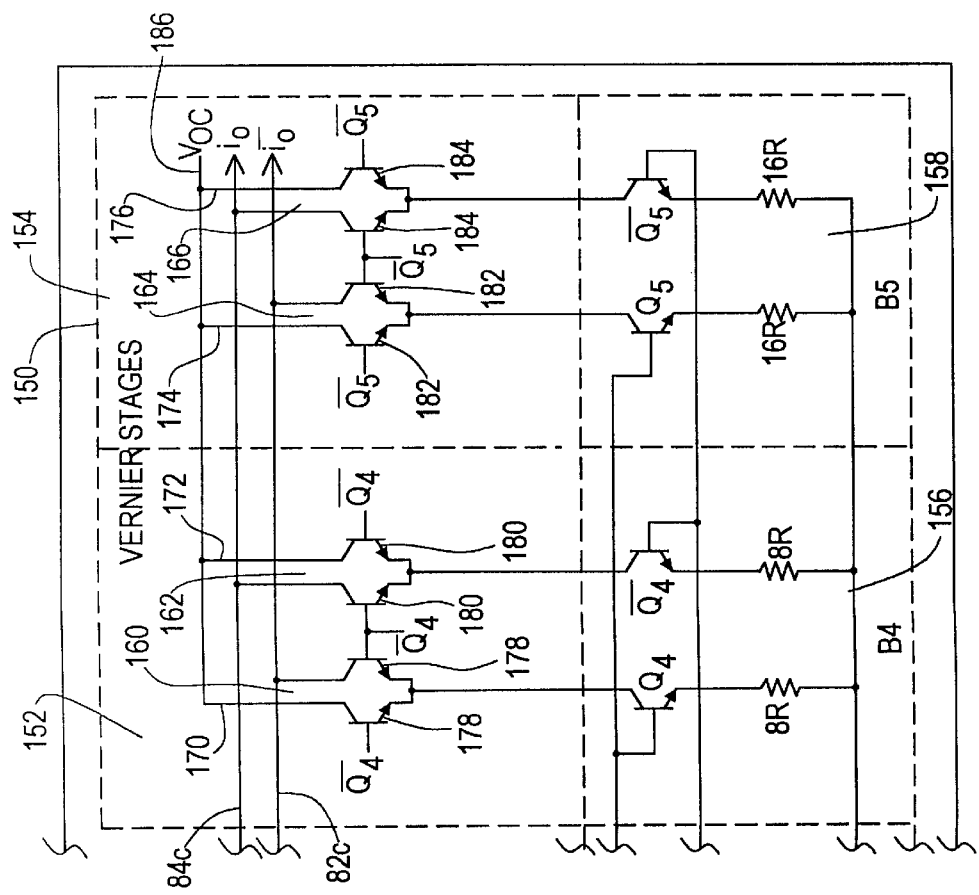
FIG. 7 is a schematic diagram showing additional vernier stages that can be added to the system of FIG. 3 for reducing the gain interval in selectable gains.

Because the characteristic gain of the system becomes steeper as the attenuation level is increased it may be desirable to provide a finer division of the intervals between the code steps and the resultant gain. For this purpose one or more vernier stages 150, FIG. 7, can be added. Each vernier stage may include a switching circuit 152, 154 and a voltage to current converter 156, 158 similar to those shown in FIG. 3. The resistances may be the same, for example, as are the eight R resistances associated with $Q_4$ and $\overline{Q_4}$, or they may be smaller such as the resistances 16R associated with $Q_5$ and $\overline{Q_5}$. The current steering switches once again are composed of two pairs 160, 162, 164, 166 of emitter connected common base transistors. However, in this case, one of the outputs is connected to an output line while the other is shunted away. The outputs 170, 172, 174 and 176 of transistors 178, 180, 182 and 184 are all shunted on line 186 to $V_{cc}$ whereas the outputs of transistors 188, 190, 192, 194 are fed variously to output lines $82c$ and $84c$ so that the resultant increments are only half steps compared to the outputs of the other switching circuits.

Figure 8:
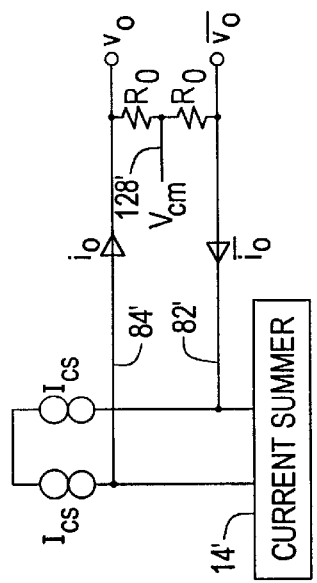
FIG. 8 is a schematic diagram of a variable gain transconductance amplifier according to this invention configured as a controlled variable voltage amplifier or attenuator.

Also, this variable gain transconductance amplifier can be configured as a controlled variable voltage amplifier or attenuator as shown in FIG. 8 by connecting two equal value resistance $R_0$ to output lines 84' and 82'. And connecting both resistors to a common mode supply voltage $V_{cm}$ at node 128'.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A digitally controlled variable transconductance amplifier system comprising:

first and second input means for receiving first and second input voltages of opposite phase;

first and second output means;

a voltage to current converter system responsive to said input voltage and including a reference voltage to current converter and a plurality of voltage to current converters each having a different gain relative to said reference voltage to current converter such that the total gain of said voltage to current converters is less than that of said reference converter; each of said converters providing a pair of oppositely phased converter output currents; and a summing system including a reference switching circuit and a plurality of switching circuits, said reference switching circuit and said switching circuits being interconnected with said reference converter and said plurality of voltage to current converters, respectively, said summing system being responsive to a digital control signal for operating each said switching circuit to selectively deliver one of the converter output currents from the associated converter to one of the first and second output means and the other of the converter output currents to the other of the output means for providing at said output means first and second output currents of opposite phase with constant common mode current and having a gain relative to said input voltages which is the sum or difference of the gains of all of the converters and is determined by the digital control signal.

2. The digitally controlled variable transconductance amplifier system of claim 1 further including first and second current sources for providing current of opposite phase to said output means.

3. The digitally controlled variable transconductance amplifier system of claim 1 in which each said converter includes an amplifier.

4. The digitally controlled variable transconductance amplifier system of claim 3 in which each said amplifier is a transconductance amplifier.

5. The digitally controlled variable transconductance amplifier system of claim 3 in which each said converter further includes impedance means for defining the different gains.

6. The digitally controlled variable transconductance amplifier system of claim 1 in which each said switching circuit includes a current steering switch.

7. The digitally controlled variable transconductance amplifier system of claim 6 in which each said current steering switch includes two pairs of emitter coupled common base transistors.

8. The digitally controlled variable transconductance amplifier system of claim 4 in which each said amplifier includes a pair of transistors with their emitters interconnected by an impedance.

9. The digitally controlled variable transconductance amplifier system of claim 8 in which each transistor includes a current source in series with its emitter.

10. The digitally controlled variable transconductance amplifier system of claim 8 in which in which each transistor includes an impedance in series with its emitter.

11. The digitally controlled variable transconductance amplifier system of claim 1 further including at least an additional vernier voltage to current converter and associated vernier switching circuit, said vernier switching circuit being responsive to said digital control signal to deliver only one of the vernier converter output currents to one of said first and second output means for reducing the interval in selectable gains.

12. The digitally controlled variable transconductance amplifier system of claim 1 in which the gains of the converters are an inverse function of $2^N$ where N is the total number of converters and the reference converter has a gain of $2^0$.

13. The digitally controlled variable transconductance amplifier system of claim 1 where the system gain or attenuation can be converted to v/v by placing resistance onto the output lines.

\* \* \* \* \*